United States Patent
Chen et al.

(10) Patent No.: US 9,070,688 B2
(45) Date of Patent: Jun. 30, 2015

(54) METHOD OF PATTERNING A SEMICONDUCTOR DEVICE HAVING IMPROVED SPACING AND SHAPE CONTROL AND A SEMICONDUCTOR DEVICE

(71) Applicant: TAIWAN SEMICONDUCTOR MANUFACTURING COMPANY, LTD., Hsinchu (TW)

(72) Inventors: Jhun Hua Chen, Chang Hua (TW); Yu-Lung Tung, Kaohsiung (TW); Chi-Tien Chen, New Taipei (TW); Hua-Tai Lin, Hsinchu (TW); Hsiang-Lin Chen, Hsinchu (TW); Hung-Chang Hsieh, Hsinchu (TW); Yi-Fan Chen, New Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/053,973

(22) Filed: Oct. 15, 2013

(65) Prior Publication Data
US 2014/0035149 A1     Feb. 6, 2014

Related U.S. Application Data

(62) Division of application No. 13/328,419, filed on Dec. 16, 2011, now Pat. No. 8,580,637.

(51) Int. Cl.
*H01L 21/8242*     (2006.01)
*H01L 23/528*     (2006.01)
*H01L 21/8238*     (2006.01)
*H01L 21/768*     (2006.01)
*H01L 21/311*     (2006.01)

(52) U.S. Cl.
CPC ...... *H01L 23/528* (2013.01); *H01L 21/823871* (2013.01); *H01L 21/76897* (2013.01); *H01L 21/8238* (2013.01); *H01L 21/31144* (2013.01)

(58) Field of Classification Search
None
See application file for complete search history.

(56) References Cited

U.S. PATENT DOCUMENTS 8,580,637 B2 *   11/2013   Chen et al. .................. 438/253
2012/0038021 A1    2/2012   Chen et al.

OTHER PUBLICATIONS

Bencher, C. et al., "Gridded Design Rule Scaling: Taking the CPU Toward the 16nm Node", Proc. of SPIE vol. 7274, Optical Microlithography XXII, (2009).

* cited by examiner

*Primary Examiner* — Kyoung Lee
(74) *Attorney, Agent, or Firm* — Lowe Hauptman & Ham, LLP

(57) ABSTRACT

A semiconductor device includes a semiconductor substrate, a first active region in the semiconductor substrate, and a second active region in the semiconductor substrate. The semiconductor device further includes a first conductive line over the semiconductor substrate electrically connected to the first active region and having a first end face adjacent to the second active region, and the first end face having an image log slope of greater than 15 $\mu m^{-1}$.

20 Claims, 4 Drawing Sheets

US 9,070,688 B2

METHOD OF PATTERNING A SEMICONDUCTOR DEVICE HAVING IMPROVED SPACING AND SHAPE CONTROL AND A SEMICONDUCTOR DEVICE

PRIORITY CLAIM

The present application is a divisional of U.S. application Ser. No. 13/328,419, filed Dec. 16, 2011, the disclosure of which is incorporated by reference herein in its entirety.

BACKGROUND

As the technology nodes shrink in some integrated circuit (IC) designs, the spacing between features continues to decrease. One process for creating conductive features in an active region of a semiconductor substrate includes placing a photoresist mask over the substrate, the photoresist mask is then patterned and etched to form the desired features. A conductive material is then formed in the features.

Metal lines formed in this manner; however, often fail to have the desired shape. For example, a feature designed to have a rectangular shape may have rounded ends and appear more oval upon implementation. The metal line ends can extend into the isolation regions and can contact one another creating a short circuit between adjacent active regions. The short circuit prevents the semiconductor device from functioning as intended.

Critical dimension uniformity (CDU) is a measure of the precision of feature size and shape. For example, when CDU is low, spacing between features must be increased because the chances of one feature being too close to another feature are high. Due to the inability to sufficiently control feature shapes, photoresist masks for conductive line patterns have become increasing complex. The complex mask is more costly to design and produce.

Mask enhancement error factor (MEEF) refers to the degree of pre-correction of a mask to compensate for imaging errors. For example, a mask intended to form rectangular shaped features may not include only vertical and horizontal lines, but also diagonal lines. As the dimensions of the mask decrease, MEEF becomes a major concern because the repositioning of openings begins to dictate the minimum spacing between features.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DESCRIPTION

The following disclosure provides many different embodiments, or examples, for implementing different features of the invention. Specific examples of components and arrangements are described below to simplify the present disclosure. These are of course, merely examples and are not intended to be limiting.

Figure 1:
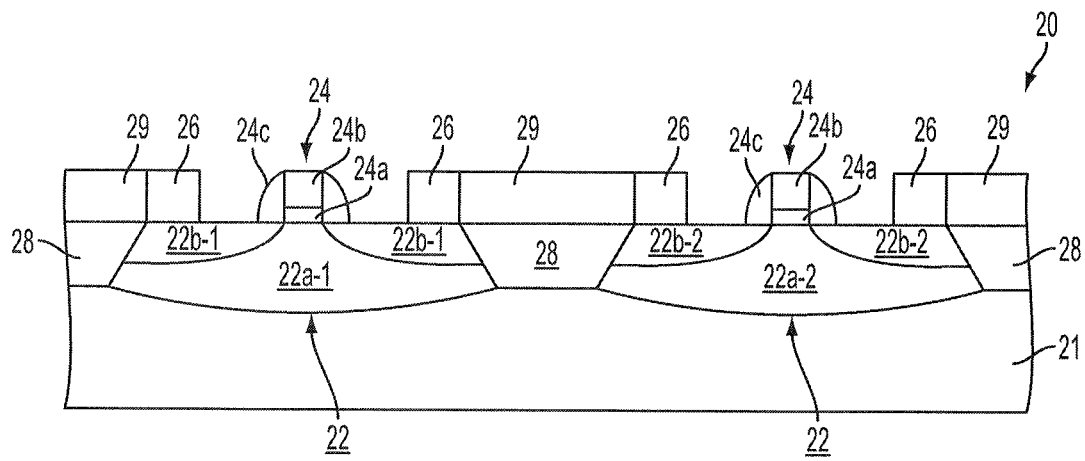
FIG. 1 is a side view of a semiconductor device according to some embodiments.

FIG. 1 is a side view of a semiconductor device 20 according to some embodiments. Semiconductor device 20 includes a semiconductor substrate 21 having multiple physically and electrically spaced active regions 22 formed therein. Semiconductor substrate 21 is silicon. In other embodiments, semiconductor substrate 21 is germanium, silicon-germanium or other suitable semiconductor material.

Active regions 22 include wells 22*a*_1 and 22*a*_2 and source/drain regions 22*b*_1 and 22*b*_2. In some embodiments, wells 22*a*_1 and 22*a*_2 are formed in the semiconductor substrate 21 through diffusion or ion implantation of the dopant material. Source/drain regions 22*b*_1 and 22*b*_2 are formed using the same method used to form wells 22*a*_1 and 22*a*_2. In other embodiments, source/drain regions 22*b*_1 and 22*b*_2 are formed using a different method than used to form wells 22*a*_1 and 22*a*_2. Active regions 22 are laid out in an arrangement called the active region pattern.

Transistors 24 are formed on the surface of semiconductor substrate 21. Transistors 24 include gate dielectric layer 24*a* and gate electrode 24*b*. In some embodiments, transistors 24 also include sidewall portions 24*c*. The type of transistor formed by transistors 24 depends on dopants used to from the wells 22*a*_1 and 22*a*_2 and source-drain regions 22*b*_1 and 22*b*_2. In an arrangement where 22*a*_1 is an n-well, source-drain regions 22*b*_1 will be p-doped and the transistors will form a p-type metal oxide semiconductor (PMOS) transistor. In an arrangement where 22*a*_1 is a p-well, source-drain regions 22*b*_1 will be n-doped and the transistors will form an n-type metal oxide semiconductor (NMOS) transistor. In some embodiments, well 22*a*_1 and well 22*a*_2 include the same material and transistors 24 are the same type of transistor. In other embodiments, well 22*a*_1 and well 22*a*_2 include different material, thus forming a complimentary metal oxide semiconductor (CMOS) transistor pair.

A material for gate dielectric layer 24*a* depends on the type of transistor formed. A gate dielectric layer for an NMOS transistor should provide high electron mobility, while a gate dielectric layer for a PMOS transistor should provide high hole mobility. For example, an NMOS transistor has a gate dielectric layer including nitride doped silicon dioxide, aluminum oxide, silicon nitride, titanium oxide or other suitable dielectric materials. A PMOS transistor, however, has a gate dielectric layer including silicon dioxide, boron doped silicon dioxide or other suitable dielectric materials. A material for gate electrode 24*b* is conductive and includes polysilicon, aluminum, copper, or other suitable conductive materials. A material for sidewalls 24*c* provides insulation from adjacent transistors and includes a high k dielectric material.

Semiconductor device 20 also includes a plurality of conductive lines 26. Conductive lines 26 electrically connect source/drain regions 22*b*_1 and 22*b*_2. In an embodiment, conductive lines 26 are tungsten. In other embodiments, conductive lines 26 are aluminum, copper, conductive polymer or other suitable conductive materials.

Semiconductor device 20 includes isolation regions 28. Isolation regions 28 separate adjacent active regions 22 and prevent current flow between active regions 22 within semiconductor substrate 20. In an embodiment, isolation regions 28 comprise shallow trench isolation (STI) features. The STI features are filled with non-electrically conductive material to prevent a short circuit from forming between active regions 22. In some embodiments, the non-electrically conductive material filling the STI features is silicon dioxide, silicon nitride, silicon oxynitride or other suitable non-electrically conductive material. In alternative embodiments, isolation regions 28 are an undoped silicate glass or other suitable means of isolating adjacent active regions.

Semiconductor device 20 further includes an electrically non-conductive interfacial layer 29. In an embodiment, interfacial layer 29 is a low k dielectric material. A low k dielectric material has a dielectric constant, k, below about 3.5. Low k dielectric materials help to minimize parasitic capacitance between adjacent features. In the embodiment of FIG. 1, interfacial layer 29 is aerogel. In other embodiments, interfacial layer 29 is fluorine-doped silicon oxide, carbon-doped silicon oxide or other suitable non-electrically conductive materials.

Method 300 begins with step 302; in which electrically nonconductive interfacial layer 29 is deposited over semiconductor substrate 21 having active regions 22 and isolation regions 28 formed therein. An electrically nonconductive intermediate layer 30 is deposited over interfacial layer 29; layers 29 and 30 form a non-electrically conductive layer arrangement. In an embodiment, intermediate layer 30 is a hard mask layer formed of silicon nitrides, silicon carbides, silicon dioxide, titanium nitride, tantalum nitride or other dielectric or non-electrically conductive materials. In other embodiments, intermediate layer 30 is a bottom anti-reflective layer (BARC) formed of silicon oxynitride, organic material or other suitable non-electrically conductive materials.

Figure 2A:
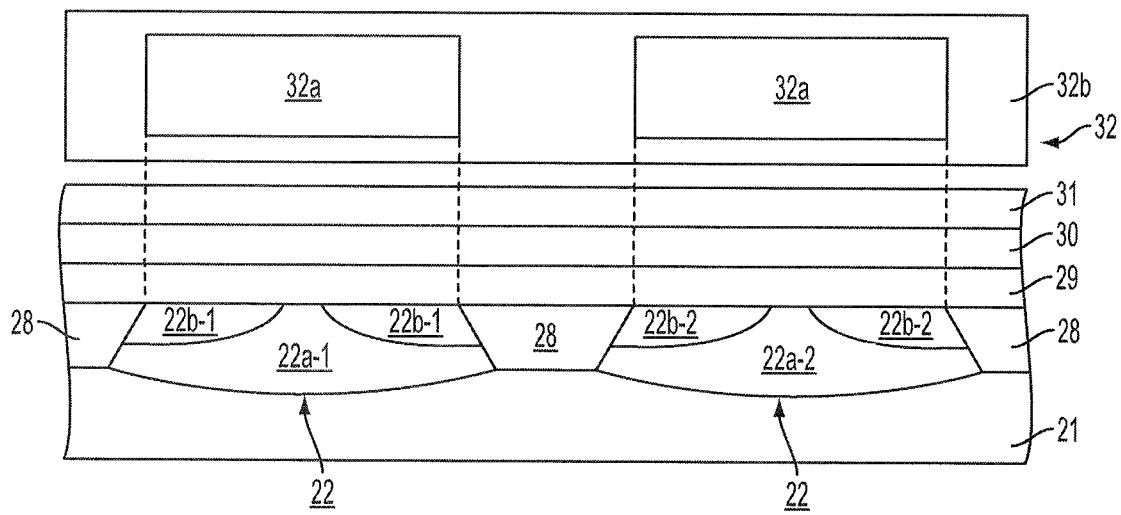
FIGS. 2A-2D are side views of a semiconductor device at various stages of development according to some embodiments.
Figure 2B:
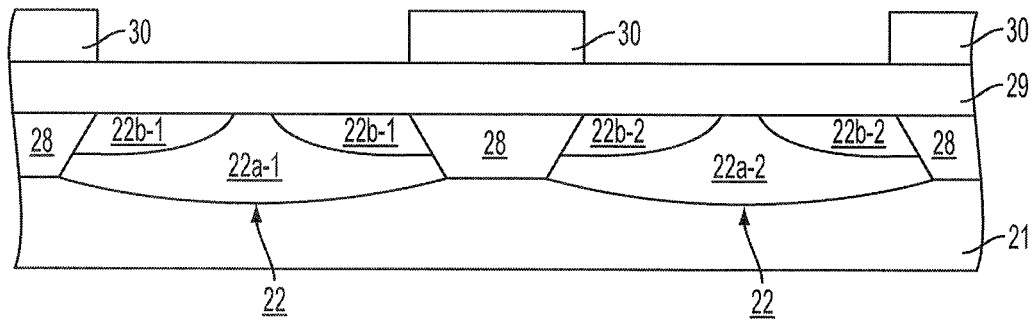

Method 300 continues with step 304, in which a first photoresist layer 31 is formed on intermediate layer 30. An active region photoresist mask 32 is positioned above first photoresist layer 31 to form the structure shown in FIG. 2A. In an embodiment, first photoresist layer 31 is a positive photoresist. In other embodiments, first photoresist layer 31 is a negative photoresist layer. A positive photoresist becomes more soluble in an etching solution following photoresist patterning with a suitable photoresist radiation source (not shown). An etching process removes the portion of a positive photoresist exposed to patterning radiation from the source. A negative photoresist becomes polymerized and less soluble in an etching solution following photoresist patterning with a suitable photoresist radiation source. An etching process removes the portion of the negative photoresist not exposed to the photoresist patterning radiation.

Active region photoresist mask 32 has two sections 32a and 32b for controlling the propagation of patterning light through active region photoresist mask 32. The boundaries of section 32a are aligned with the boundaries of the active region pattern. The boundaries of section 32b are aligned with the boundaries of isolation regions 28. When first photoresist layer 31 is a positive photoresist material, a section 32a of active region photoresist mask 32 is transparent to patterning radiation and section 32b blocks patterning radiation from contacting the surface of first photoresist layer 31 above the isolation regions. The pattern of the active region photoresist mask 32 used with a positive first photoresist layer 31 is called the inverse of the layout of the active region because the mask transmits patterning radiation from the patterning radiation source onto first photoresist layer 31 in an area directly above active regions 22 (e.g. the position of the blocking portions of the active region photoresist mask 32 are the inverse of the layout of the active region). When first photoresist layer 31 is a negative photoresist material, section 32a blocks patterning radiation from contacting the surface of first photoresist layer 31 above active regions 22, and sections 32b are transparent to patterning radiation.

In the embodiment of FIGS. 1 and 2A-2D, the active region pattern is substantially rectilinear. In other embodiments, the active region pattern has other shapes including free form shapes as is recognizable by one of ordinary skill in the art.

In step 306, first photoresist layer 31 is patterned by passing radiation through active region photoresist mask 32 onto first photoresist layer 31. The patterning process transfers the pattern of active region photoresist mask 32 onto first photoresist layer 31. In an embodiment, the photoresist patterning radiation is ultraviolet light for the positive and negative photoresist materials. In other embodiments, the photoresist patterning radiation comprises infra-red light or other suitable wavelengths. Following the patterning process, active region photoresist mask 32 is removed and stored for use with subsequent semiconductor devices. Active region photoresist mask 32 generally does not require cleaning because it does not come into contact with the first photoresist layer 31.

Method 300 continues with step 308, in which first photoresist layer 31 and intermediate layer 30 are etched. The etching process removes a portion from both layers matching the active region pattern. In an embodiment, first photoresist layer 31 and intermediate layer 30 are etched using a plasma dry etching process comprising plasma containing carbon, fluorine, argon and/or nitrogen. In other embodiments, first photoresist layer 31 and intermediate layer 30 are etched using wet etching or other suitable methods. Upon completion of the etching process used to form the active region pattern in the intermediate layer 30, first photoresist layer 31 is removed to form the structure of FIG. 2B that includes an exposed top face of intermediate layer 30 with an etched pattern matching the active region pattern therein. In an embodiment, photoresist 31 is removed using a wet chemistry process. In other embodiments, photoresist 31 is removed by any one of dry chemistry process, selective etching, plasma ashing, or other suitable methods.

Figure 2C:
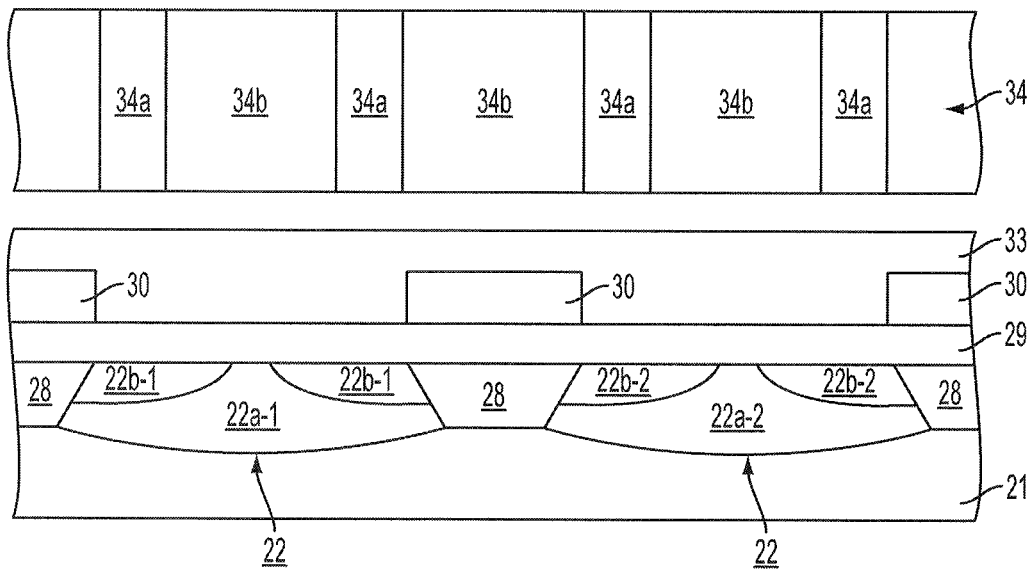
Figure 2D:
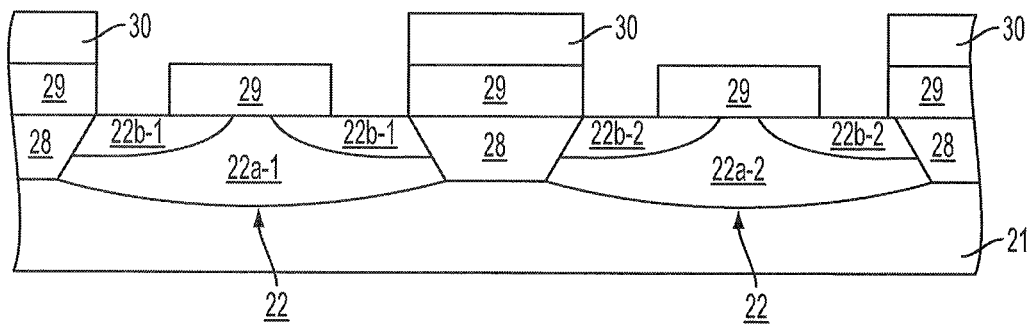
Figure 3:
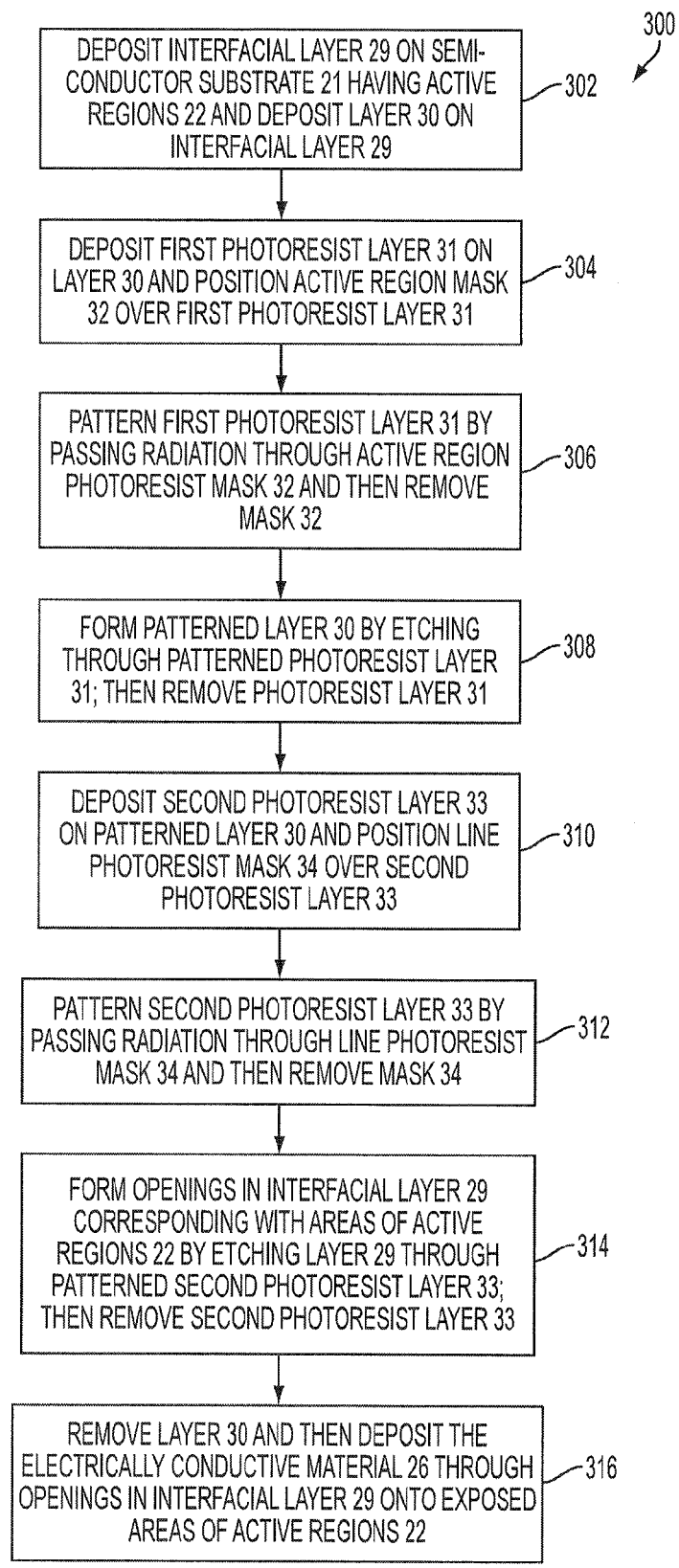
FIG. 3 is a flow chart of a method of making a semiconductor device of FIGS. 1 and 2A-2D according to some embodiments.

In step 310, second photoresist layer 33 is formed on the patterned intermediate layer 30 and a line photoresist mask 34 is then positioned over second photoresist layer 33, as shown in FIG. 2C. In some embodiments, second photoresist layer 33 has the same material as first photoresist layer 31. In other embodiments, second photoresist layer 33 has a different material than first photoresist layer 31.

In an embodiment, line photoresist mask 34 has a pattern of rectangular shaped openings 34a separated by rectangular shaped blocking portions 34b, as shown in FIG. 2C. In other embodiments, line photoresist mask 34 has a pattern of other shapes as recognizable by one of ordinary skill in the art. In the embodiment of FIG. 2C, the spacing between openings 34a is periodic, that is, each of openings 34a has the same size, shape and spacing and each of blocking portions 34b has the same size, shape and spacing. In other embodiments, the spacing between openings 34a is variable. As in step 304, the pattern of the line photoresist mask 34 must complement the type of photoresist (i.e. positive or negative) used in second photoresist layer 33. The line photoresist mask 34 pattern overlays the etched pattern formed in the intermediate layer 30 in step 308.

Second photoresist layer 33 is then patterned, in step 312, by passing radiation through line photoresist mask 34 onto second photoresist layer 33. In some embodiments, the patterning radiation used in step 312 is the same as the pattern radiation used in step 306. In other embodiments, the pattern radiation used in step 312 is different than the pattern radiation used in step 306. In the embodiment of FIGS. 1 and 2A-2D, second photoresist layer 33 is a positive photoresist.

In other embodiments, second photoresist layer 33 is a negative photoresist. Following the patterning process, line photoresist mask 34 is removed and stored for use in forming subsequent semiconductor devices. Similar to active region photoresist mask 32, line photoresist mask 34 does not come into contact with second photoresist layer 33 and therefore generally does not require cleaning. A second interfacial layer (not shown) can optionally be formed between the etched intermediate layer 30 and second photoresist layer 33.

Method 300 continues in step 314, in which second photoresist layer 33 and interfacial layer 29 are etched to expose a portion of active regions 22 matching the pattern of the line photoresist mask 34. The second interfacial layer (not shown) is also etched during this step, if present. In an embodiment, second photoresist layer 33 and interfacial layer 29 are etched using a plasma dry etching process comprising plasma containing carbon, fluorine, argon and/or nitrogen. In other embodiments, second photoresist layer 33 and interfacial layer 29 are etched using wet etching or other suitable methods. Upon completion of the etching process used to form the line photoresist mask pattern in interfacial layer 29, second photoresist layer 33 is removed to form the structure of FIG. 2D that includes an exposed top face of active regions 22 with a pattern matching the line photoresist mask 34 pattern therein. In an embodiment, second photoresist layer 33 is removed using a wet chemistry process. In other embodiments, second photoresist layer 33 is removed by any one of dry chemistry process, selective etching, plasma ashing, or other suitable methods.

Method 300 concludes with step 316, in which the etched intermediate layer 30 is completely removed and conductive lines 26 are deposited in the openings of interfacial layer 29. In an embodiment, intermediate layer 30 is removed using plasma etching. In other embodiments, intermediate layer 30 is removed using wet etching, dry etching or other suitable methods.

After intermediate layer 30 is removed, conductive lines 26 are deposited on the active regions 22 in the openings etched into interfacial layer 29 matching the pattern of the line photoresist mask 34. In an embodiment, conductive lines 26 are tungsten. In other embodiments, conductive lines 26 are aluminum, copper, conductive polymer or other suitable materials. In an embodiment, conductive lines 26 are formed in the openings using physical vapor deposition. In other embodiments, conductive lines 26 are formed using chemical vapor deposition, plasma deposition or other suitable methods.

Following deposition of conductive lines 26, additional portions of interfacial layer 29 are removed by etching or other suitable process and transistors 24 are formed on the surface of semiconductor substrate 21 to form the structure shown in FIG. 1. Transistors 24 are formed using techniques recognized by one of ordinary skill in the art.

Figure 4:
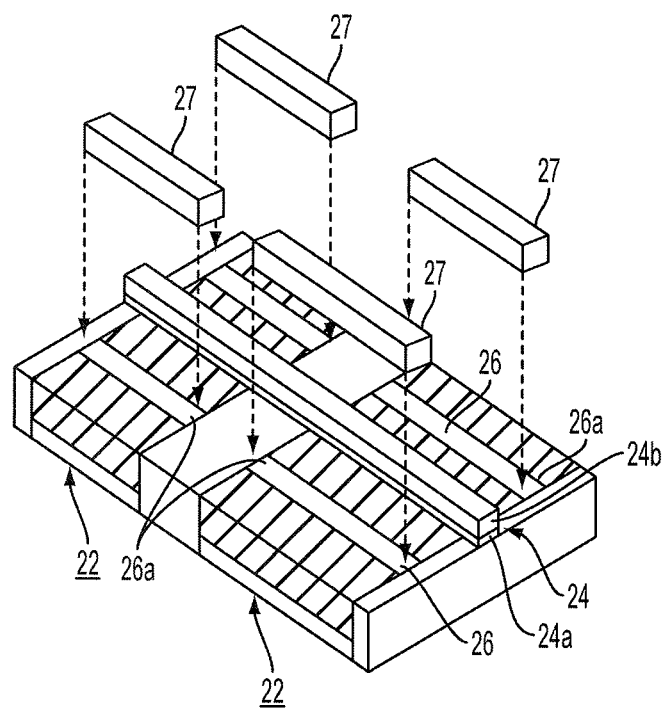
FIG. 4 is a perspective view of a semiconductor device formed using the method of FIG. 3 according to some embodiments.

FIG. 4 is a perspective view of the semiconductor device according to some embodiments. The line ends 26a exhibit high contrast. Contrast measures the abruptness of the end of the feature shape. For example, a feature having a substantially vertical wall at the end of the shape has a higher contrast than a feature having a sloped wall at the end of the shape. Intermediate layer 30 acts as a stop for the line pattern etched into interfacial layer 29, thus making the ends of the openings more defined and less rounded. Contrast is often measured in terms of image log slope. Image log slope is slope of a logarithm of a patterned feature at the nominal edge of a design pattern. In some embodiments, the spacing between lines 26 is greater than 100 nm. In some embodiments, the spacing between lines 26 is less than 100 nm. When the spacing between lines is less than 100 nm, the image log slope of the conductive lines 26 dramatically drops to less than 15 $\mu m^{-1}$ and increases the likelihood of a short circuit. Intermediate layer 30 helps to maintain a sufficient image log slope of conductive lines 26 to decrease the likelihood of a short circuit.

The use of two separate masks and two separate etching processes, also results in a higher CDU. Higher CDU allows precision and predictability in the formation of features in a semiconductor device, which enables more densely packed features in a semiconductor device.

The use of two separate masks and two separate etching processes, also results in lower MEEF which allows more densely packed features in a semiconductor device. Lower MEEF also makes the photoresist masks 32 and 34 easier to produce. Imaging errors in the line photoresist mask 34 pattern are compensated for by the etched intermediate layer 30 which defines the ends of the lines etched into interfacial layer 29. The active region photoresist mask 32 and line photoresist mask 34 therefore require less calculation and experimentation to determine optimal mask designs.

One aspect of the description relates to a semiconductor device. The semiconductor device includes a semiconductor substrate, a first active region in the semiconductor substrate, and a second active region in the semiconductor substrate. The semiconductor device further includes a first conductive line over the semiconductor substrate electrically connected to the first active region and having a first end face adjacent to the second active region, and the first end face having an image log slope of greater than 15 $\mu m^{-1}$.

Another aspect of this description relates to a semiconductor device. The semiconductor device includes a semiconductor substrate, a first active region in the semiconductor substrate, and a second active region in the semiconductor substrate. The semiconductor device further includes a gate electrode extending over the first active region and the second active region. The semiconductor device further includes a first conductive line over the semiconductor substrate electrically connected to the first active region, the first conductive line has an end face adjacent the second active region. The semiconductor device further includes a second conductive line over the semiconductor substrate electrically connected to the second active region, the second conductive line has an end face adjacent to the first active region. A distance between the end face of the first conductive line and the end face of the second conductive line is less than 100 nm.

Still another aspect of the description relates to a method of patterning a semiconductor device. The method includes forming an intermediate layer on a semiconductor substrate having an active region, and etching the intermediate layer to transfer an active region pattern to the intermediate layer. The method further includes forming a second photoresist on the etched intermediate layer, and positioning a line photoresist mask between the second photoresist and a photoresist patterning source that patterns the second photoresist. The method further includes etching the patterned second photoresist to expose a portion of the active region pattern of the intermediate layer.

The above description discloses exemplary steps, but they are not necessarily required to be performed in the order described. Steps can be added, replaced, changed in order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A semiconductor device comprising:
   a semiconductor substrate;
   a first active region in the semiconductor substrate;
   a second active region in the semiconductor substrate;
   a first conductive line over the semiconductor substrate electrically connected to the first active region and having a first end face adjacent to the second active region, and the first end face having an image log slope of greater than 15 $\mu m^{-1}$.

2. The semiconductor device of claim 1, further comprising:
   a third active region in the semiconductor substrate;
   a fourth active region in the semiconductor substrate; and
   a second conductive line over the semiconductor substrate electrically connected to the third active region and having a second end face adjacent to the fourth active region, and the second end face having an image log slope of greater than 15 $\mu m^{-1}$, and a distance between the first conductive line and the second conductive line is less than 100 nm.

3. The semiconductor device of claim 2, further comprising an isolation region between the first conductive line and the second conductive line.

4. The semiconductor device of claim 3, wherein neither the first conductive line nor the second conductive line substantially overlap the isolation region.

5. The semiconductor device of claim 1, wherein the first conductive line comprises at least one of tungsten, aluminum, copper, or conductive polymer.

6. A semiconductor device comprising:
   a semiconductor substrate;
   a first active region in the semiconductor substrate;
   a second active region in the semiconductor substrate;
   a gate electrode extending over the first active region and the second active region;
   a first conductive line over the semiconductor substrate electrically connected to the first active region, the first conductive line has an end face adjacent the second active region; and
   a second conductive line over the semiconductor substrate electrically connected to the second active region, the second conductive line has an end face adjacent to the first active region, wherein a distance between the end face of the first conductive line and the end face of the second conductive line is less than 100 nm.

7. The semiconductor device of claim 6, wherein the end face of the first conductive line has an image log slope of greater than 15 $\mu m^{-1}$.

8. The semiconductor device of claim 6, wherein the end face of the second conductive line has an image log slope of greater than 15 $\mu m^{-1}$.

9. The semiconductor device of claim 6, wherein the first conductive line and the second conductive line are on a same side of the gate electrode.

10. The semiconductor device of claim 6, further comprising:
    a third active region in the semiconductor substrate;
    a fourth active region in the semiconductor substrate; and
    a third conductive line over the semiconductor substrate electrically connected to the third active region, the first conductive line has an end face adjacent the fourth active region; and
    a fourth conductive line over the semiconductor substrate electrically connected to the fourth active region, the fourth conductive line has an end face adjacent to the third active region, wherein a distance between the end face of the third conductive line and the end face of the fourth conductive line is less than 100 nm.

11. The semiconductor device of claim 10, wherein the end face of the third conductive line has an image log slope of greater than 15 $\mu m^{-1}$.

12. The semiconductor device of claim 10, wherein the end face of the fourth conductive line has an image log slope of greater than 15 $\mu m^{-1}$.

13. The semiconductor device of claim 10, wherein the third conductive line and the fourth conductive line are on a same side of the gate electrode.

14. The semiconductor device of claim 10, wherein the first conductive line is on an opposite side of the gate electrode from the third conductive line.

15. The semiconductor device of claim 10, further comprising an isolation structure between the first active region and the third active region.

16. The semiconductor device of claim 6, further comprising an electrically nonconductive layer between the first conductive line and the second conductive line.

17. The semiconductor device of claim 6, wherein the first conductive line comprises at least one of tungsten, aluminum, copper, or conductive polymer.

18. The semiconductor device of claim 6, wherein the second conductive line comprises at least one of tungsten, aluminum, copper, or conductive polymer.

19. The semiconductor device of claim 6, wherein the first active region has a same dopant type as the second active region.

20. A method of patterning a semiconductor device comprising the steps of:
    forming an intermediate layer on a semiconductor substrate having an active region;
    etching the intermediate layer to transfer an active region pattern to the intermediate layer;
    thereafter forming a second photoresist on the etched intermediate layer;
    thereafter positioning a line photoresist mask between the second photoresist and a photoresist patterning source that patterns the second photoresist; and
    thereafter etching the patterned second photoresist to expose a portion of the active region pattern of the intermediate layer, wherein an end face of the exposed portion of the active region pattern has an image log slope of greater than 15 $\mu m^{-1}$.

* * * * *